(12) United States Patent  (10) Patent No.: US 11,862,502 B2
Wei et al.                (45) Date of Patent:     Jan. 2, 2024

(54) DEVICE, APPARATUS, AND METHOD FOR SEMICONDUCTOR TRANSFER

(71) Applicant: CHONGQING KONKA PHOTOELECTRIC TECHNOLOGY RESEARCH INSTITUTE CO., LTD., Chongqing (CN)

(72) Inventors: Qiyuan Wei, Chongqing (CN); Ying-chi Wang, Chongqing (CN); Cheng-ming Liu, Chongqing (CN); Chien-hung Lin, Chongqing (CN); Li-wei Kung, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 350 days.

(21) Appl. No.: 17/369,360

(22) Filed: Jul. 7, 2021

(65) Prior Publication Data
US 2021/0335648 A1    Oct. 28, 2021

Related U.S. Application Data

(63) Continuation of application No. PCT/CN2020/113362, filed on Sep. 4, 2020.

(30) Foreign Application Priority Data

Apr. 21, 2020 (CN) .......................... 202010317744.1

(51) Int. Cl.
*H01L 21/683* (2006.01)
*H01L 21/68* (2006.01)
(Continued)

(52) U.S. Cl.
CPC ........ *H01L 21/6835* (2013.01); *B25J 13/088* (2013.01); *B25J 15/0004* (2013.01);
(Continued)

(58) Field of Classification Search
CPC combination set(s) only.
See application file for complete search history.

(56) References Cited

U.S. PATENT DOCUMENTS 4,840,417 A * 6/1989 Izumi ...................... H01F 7/206
                                                    294/65.5
6,337,489 B1   1/2002 Matsumoto et al.
(Continued)

FOREIGN PATENT DOCUMENTS

CN    107527973 A    12/2017
CN    109378370 A    2/2019
(Continued)

OTHER PUBLICATIONS

International Search Report issued in corresponding International Application No. PCT/CN2020/113362, dated Jan. 21, 2021, pp. 1-8, Beijing, China.
(Continued)

*Primary Examiner* — Lisa Lea-Edmonds
(74) *Attorney, Agent, or Firm* — Hauptman Ham, LLP

(57) ABSTRACT

A device, apparatus, and method for semiconductor transfer are provided. A transfer substrate is controlled to be moved to be above the target substrate. An infrared emitting portion emits infrared signals to position a semiconductor on a target substrate. After a second magnetic portion picks up the semiconductor from the target substrate, a controller outputs a first control current to a first electromagnetic portion to cause the first electromagnetic portion to generate an electromagnetic force, to control the second magnetic portion to adjust a position of the picked-up semiconductor relative to
(Continued)

the welding position on the target substrate, where adjusting the position of the picked up semiconductor includes horizontal adjustment.

20 Claims, 3 Drawing Sheets

(51) Int. Cl.
    *H01F 7/20*     (2006.01)
    *B25J 15/06*     (2006.01)
    *B25J 13/08*     (2006.01)
    *B25J 15/00*     (2006.01)
    *H01F 7/06*     (2006.01)

(52) U.S. Cl.
    CPC .......... *B25J 15/0608* (2013.01); *H01F 7/064* (2013.01); *H01F 7/206* (2013.01); *H01L 21/681* (2013.01); *H01F 2007/208* (2013.01)

(56) References Cited

U.S. PATENT DOCUMENTS

| | | | | |
|---|---|---|---|---|
| 8,081,459 | B2* | 12/2011 | Doll | G06F 1/20 |
| | | | | 361/698 |
| 8,964,375 | B2* | 2/2015 | Claassen | H05K 7/20736 |
| | | | | 361/679.5 |
| 9,698,134 | B2* | 7/2017 | Li | H01L 25/50 |
| 10,566,125 | B2* | 2/2020 | Wu | H05K 13/0408 |
| 11,107,711 | B2* | 8/2021 | Zhang | H01L 21/68 |
| 2008/0010845 | A1* | 1/2008 | Bailey | H01L 21/67069 |
| | | | | 414/757 |
| 2014/0362523 | A1* | 12/2014 | Degner | H05K 7/20009 |
| | | | | 361/679.47 |
| 2018/0301265 | A1* | 10/2018 | Wu | H01F 13/006 |
| 2019/0115233 | A1* | 4/2019 | Chen | H01L 25/167 |
| 2021/0005775 | A1* | 1/2021 | Chen | H01L 24/73 |
| 2021/0134624 | A1* | 5/2021 | Zhang | H01L 21/67144 |
| 2021/0335648 | A1* | 10/2021 | Wei | B25J 15/0608 |
| 2022/0238267 | A1* | 7/2022 | Hoshi | H02P 25/064 |
| 2022/0336260 | A1* | 10/2022 | Shindo | B65G 43/08 |

FOREIGN PATENT DOCUMENTS

| | | |
|---|---|---|
| CN | 109755162 A | 5/2019 |
| CN | 109791910 A | 5/2019 |
| CN | 110088886 A | 8/2019 |
| CN | 110379760 A | 10/2019 |
| CN | 110729221 A | 1/2020 |
| CN | 110867400 A | 3/2020 |
| JP | 2000012571 A | 1/2000 |
| KR | 20200026669 A | 3/2020 |
| TW | 201515980 A | 5/2015 |
| WO | 2013183202 A1 | 12/2013 |

OTHER PUBLICATIONS

C.A. Bower, Transfer Printing: an Approach for Massively Parallel Assembly of Microscale Devices, dated 2010.
Notice of Allowance issued in corresponding CN application No. 202010317744.1 dated Mar. 7, 2022.
The First Office Action issued in corresponding CN application No. 202010317744.1 dated Jan. 28, 2022.

* cited by examiner

DEVICE, APPARATUS, AND METHOD FOR SEMICONDUCTOR TRANSFER

CROSS-REFERENCE TO RELATED APPLICATION(S)

This application is a continuation of International Application No. PCT/CN2020/113362, filed on Sep. 4, 2020, which claims priority to Chinese Patent Application No. 202010317744.1, filed on Apr. 21, 2020, the entire disclosures of which are hereby incorporated by reference.

TECHNICAL FIELD

This disclosure relates to the technical field of manufacturing of semiconductor displays, and more particularly to a device, apparatus, and method for semiconductor transfer.

BACKGROUND

With the continuous development of semiconductors, micro light-emitting diode (micro-LED) technology, i.e., LED miniaturization and matrix technology, is a new-generation display technology. The micro-LED refers to an LED array that is integrated on a chip and has high density and small size. For example, each pixel of a micro-LED display can be addressed and driven to be lighted up separately. The micro-LED display can be regarded as miniaturization of an outdoor LED display, and in the micro-LED display distances among pixel points are reduced from a millimeter level to a micron level. Since a relatively high efficiency, yield of 99.9999%, and transfer accuracy within plus or minus 0.5 μm generally need to be guaranteed in the packaging process, and a size of the micro-LED is substantially less than 50 μm and generally tens of thousands to millions of micro-LEDs are provided, a technical problem that still needs to be solved in micro-LED industry is how to achieve mass transfer of the micro-LEDs. For a current ultra-precision machining technology, transferring tens of thousands to hundreds of thousands of micro-LEDs from wafers to a substrate is a hard work, let alone ensuring the processing efficiency, yield, and transfer accuracy.

The existing technology of mass transfer can transfer a large number of semiconductor chips simultaneously. However, during mass transfer, the semiconductor chips cannot be accurately positioned when being transferred to the substrate, so it is easy to lead to inaccuracy of welding of the transferred semiconductor chips.

Therefore, the existing technology needs to be improved and developed.

SUMMARY

In view of the above, the disclosure aims to provide a device, apparatus, and method for semiconductor transfer, to solve a problem that a transfer accuracy of semiconductor chips is relatively low during mass transfer in the related art.

The technical solution adopted by the disclosure to solve the technical problems is as follows.

A device for semiconductor transfer is provided. The device includes a transfer substrate, a controller disposed on the transfer substrate, a first electromagnetic portion disposed on the transfer substrate and electrically coupled to the controller, an infrared emitting portion disposed on a surface of the first electromagnetic portion and electrically coupled to the controller, and a second magnetic portion movably disposed in the first electromagnetic portion and configured to pick up a semiconductor from a target substrate, where the semiconductor is a magnetic semiconductor.

The transfer substrate is capable of being moved to be above the target substrate.

The infrared emitting portion is configured to emit infrared signals to position the semiconductor on the target substrate.

The controller is configured to output a first control current to the first electromagnetic portion to cause the first electromagnetic portion to generate an electromagnetic force, to control the second magnetic portion to adjust a horizontal position of the picked-up semiconductor relative to the target substrate.

In at least one implementation, the controller is further configured to output a second control current to the second magnetic portion to cause the second magnetic portion, to pick up the semiconductor from the target substrate or place the semiconductor on the target substrate.

In at least one implementation, the first electromagnetic portion includes multiple first electromagnetic baffles movably disposed on the transfer substrate, where each first electromagnetic baffle is electrically coupled to the controller, and each two adjacent first electromagnetic baffles are perpendicular to each other.

In at least one implementation, the second magnetic portion includes a driving electromagnetic baffle disposed on the transfer substrate and electrically coupled to the controller, a suction disk magnetically coupled to the driving electromagnetic baffle, and multiple second magnetic baffles fixedly arranged around the suction disk.

In at least one implementation, number of the multiple first electromagnetic baffles is the same as that of the multiple second magnetic baffles, where each first electromagnetic baffle is parallel to a corresponding second magnetic baffle.

In at least one implementation, the transfer substrate is provided with a sliding rail, and the first electromagnetic baffle and the driving electromagnetic baffle each are provided with a sliding ball. The first electromagnetic baffle and the driving electromagnetic baffle are slidably coupled with the transfer substrate, respectively.

In at least one implementation, the first electromagnetic baffle and the driving electromagnetic baffle are electromagnets, and the second magnetic baffle is a permanent magnet or an electromagnet.

In at least one implementation, the infrared emitting portion includes an infrared emitter detachably coupled to the first electromagnetic portion.

In at least one implementation, the suction disk is a magnet, a chuck, or a manipulator.

An apparatus for semiconductor transfer is provided. The apparatus includes a target substrate and the device for semiconductor transfer described above.

In at least one implementation, the target substrate is provided with an infrared receiver for feeding back position information of the semiconductor on the target substrate.

In at least one implementation, the target substrate includes a first target substrate on which a semiconductor to be transferred is grown, and a second target substrate configured to receive the semiconductor to be transferred.

In at least one implementation, the second target substrate is provided with electrodes corresponding to the semiconductor to be transferred.

A method for semiconductor transfer is provided. The method includes the following. A transfer substrate is controlled to be moved to be above a target substrate. A semiconductor on the target substrate is positioned by emitting infrared signals by an infrared emitting portion. A controller outputs a first control current to a first electromagnetic portion to cause the first electromagnetic portion to generate an electromagnetic force, to control a second magnetic portion to adjust a horizontal position of the picked-up semiconductor relative to the target substrate.

In at least one implementation, the method further includes the following. The controller outputs a second control current to a second magnetic portion, to cause the second magnetic portion to pick up the semiconductor from the target substrate or place the semiconductor on the target substrate.

According to the device, apparatus, and method for semiconductor transfer provided herein, the transfer substrate is controlled to be moved to be above the target substrate. The infrared emitting portion emits infrared signals to position the semiconductor on the target substrate. After the second magnetic portion picks up the semiconductor from the target substrate, the controller outputs the first control current to the first electromagnetic portion to cause the first electromagnetic portion to generate an electromagnetic force, to control the second magnetic portion to adjust a position of the picked-up semiconductor relative to the welding position on the target substrate, where adjusting the position of the picked up semiconductor includes horizontal adjustment. In this way, it is possible to ensure the accurate alignment of the semiconductor and the target substrate in the transfer process. The device for semiconductor transfer provided herein can accurately pick up semiconductors with aid of an infrared function, and can also adjust the horizontal position of the semiconductors by magnetic force after picking up the semiconductor, thereby providing accurate positioning for the semiconductor when the semiconductor needs to be welded on the target substrate and avoiding inaccuracy of welding of the semiconductor.

In the figures: 100: transfer substrate; 200: controller; 300: first electromagnetic portion; 400: infrared emitting portion; 500: second magnetic portion; 600: semiconductor; 800, sliding ball; 900: target substrate; 310: first electromagnetic baffle; 510: suction disk; 520: second magnetic baffle; 530: driving electromagnetic baffle.

DETAILED DESCRIPTION

In order to enable those skilled in the art to better understand objects, technical solutions, and advantages of the disclosure, the solutions of the disclosure will be further described below through implementations with reference to the accompanying drawings. It will be appreciated that the implementations are described herein for the purpose of explaining the disclosure rather than limiting the disclosure.

In the implementations and the scope of the disclosure, the article "a", "an", or "the" may generally represents one or more, unless otherwise specified.

In addition, if there are descriptions on "first", "second" and the like in implementations of the disclosure, the terms "first", "second", and the like are for descriptive purposes, and cannot be understood as indicating or implying relatively importance of technical features indicated or implicitly indicating the number of the technical features. Therefore, the features defined with "first", "second", or the like may explicitly or implicitly include at least one of the features. In addition, the technical solutions of various implementations can be combined with each other, if the combined implementations can be achieved by a person of ordinary skill in the art. When technical solutions of various implementations contradicts or the combined implementations cannot be realized, it should be considered that such combination of technical solutions does not exist and fall within the scope of protection claimed by the disclosure.

Figure 1:
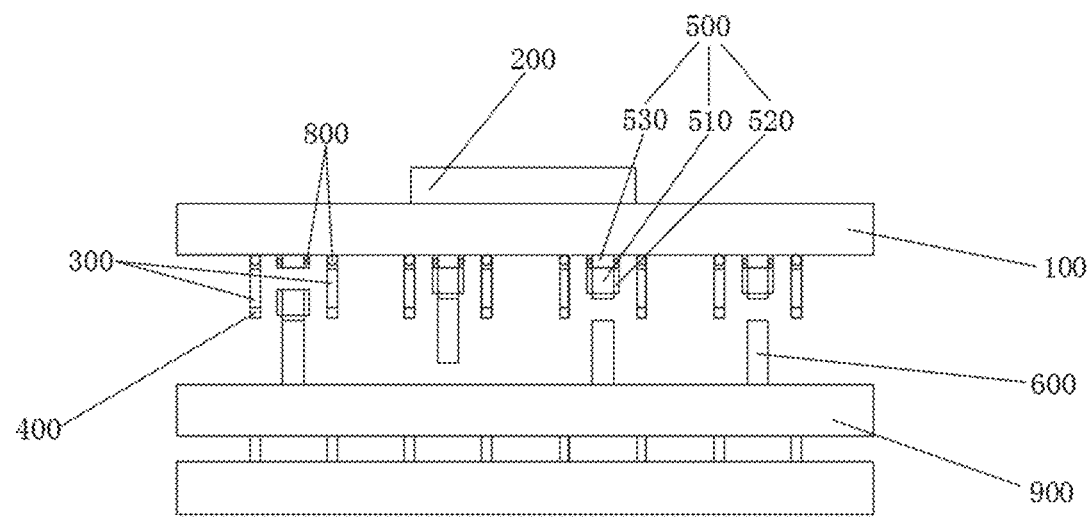
FIG. 1 is a schematic view illustrating an operating state of a device for semiconductor transfer according to the disclosure.

In at least one implementation, FIG. 1 is a schematic view illustrating an operating state of a device for semiconductor transfer according to the disclosure. As illustrated in FIG. 1, the device for semiconductor transfer includes a transfer substrate 100, a controller 200 disposed on the transfer substrate 100, multiple first electromagnetic portions 300 disposed on the transfer substrate 100 and electrically coupled to the controller 200, multiple infrared emitting portions 400, and multiple second magnetic portions 500. Each infrared emitting portion is disposed on a surface of a corresponding first electromagnetic portion 300 and electrically coupled to the controller 200. Each second magnetic portion 500 is movably disposed in a corresponding first electromagnetic portion 300 and configured to pick up a corresponding semiconductor 600. The semiconductor 600 has magnetism.

The transfer substrate 100 is capable of being moved to be above a target substrate 900. The infrared emitting portion 400 is configured to emit infrared signals to position the semiconductor 600 on the target substrate 900. The controller 200 is configured to output a first control current to the first electromagnetic portion 300 to cause the first electromagnetic portion 300 to generate an electromagnetic force, to control the second magnetic portion 500 to adjust a position of the picked-up semiconductor relative to a welding position on the target substrate, where adjusting the position of the picked-up semiconductor includes horizontal adjustment.

In at least one implementation, the controller 200 is further configured to output a second control current to the second magnetic portion 500, to cause the second magnetic portion 500 to pick up the semiconductor from the target substrate or place the semiconductor on the target substrate.

Figure 2:
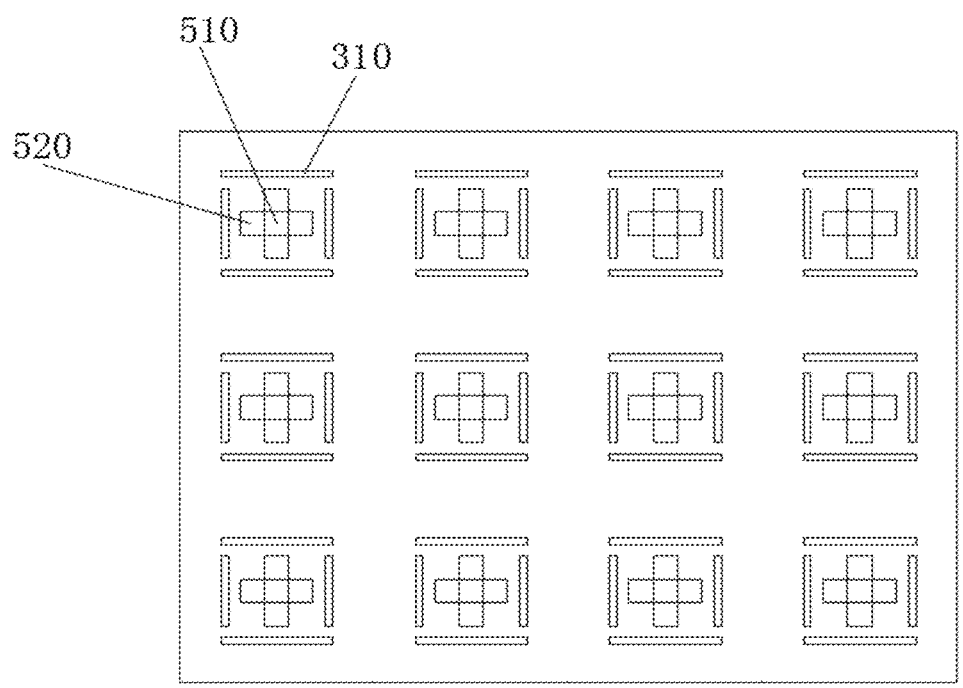
FIG. 2 is a bottom view illustrating a device for semiconductor transfer according to the disclosure.

FIG. 2 is a bottom view illustrating a device for semiconductor transfer according to the disclosure. Each first electromagnetic portion 300 includes multiple first electromagnetic baffles 310 that are movably disposed on the transfer substrate 100. Each two adjacent first electromagnetic baffles 310 of the first electromagnetic portion 300 are perpendicular to each other and not directly connected. As illustrated in FIG. 2, the first electromagnetic portion 300 includes four first electromagnetic baffles 310. The four first electromagnetic baffles 310 are arranged around the second magnetic portion 500. Since a distance between any one of the first electromagnetic baffles 310 and the second magnetic portion 500 is equal to that between another of the first electromagnetic baffles 310 and the second magnetic portion 500, the second magnetic portion 500 disposed in the first electromagnetic portion 300 can move horizontally by means of magnetic force.

As one example, continuing to refer to FIG. 2, each second magnetic portion 500 includes a driving electromagnetic baffle 530 disposed on the transfer substrate and electrically coupled to the controller 200, a suction disk 510 magnetically coupled to the driving electromagnetic baffle 530, and multiple second magnetic baffles 520 fixedly arranged around the suction disk 510. The second magnetic baffle 520 is configured to generate a magnetic force with the driving electromagnetic baffle 530 or the first electromagnetic baffle 310, so as to drive the suction disk 510 to move back and forth in a vertical direction or a horizontal direction. As another example, the suction disk 510 is electrically coupled to the controller 200 and is controlled by the controller 200 to pick up the semiconductor 600 from the target substrate 900 or place the semiconductor 600 on the target substrate 900. In one example, four second magnetic baffles 520 are disposed. Each two adjacent second magnetic baffles 520 are perpendicular to each other. Two opposite second magnetic baffles 520 mutually repel. For example, if the electromagnetic polarity of one second magnetic baffle 520 is N pole, the electromagnetic polarity of the other second magnetic baffle 520 is N pole.

In one example, when it is necessary to pick up the semiconductors 600 from the target substrate, the transfer substrate 100 can be controlled to be moved to be above the target substrate, and then the infrared emitting portion 400 emits infrared signals to position the semiconductor 600 on the target substrate. It can be understood that the target substrate is correspondingly provided with an infrared receiver (not illustrated in the figures). After receiving the infrared signals emitted by the infrared emitting portion 400, the infrared receiver feeds back position information of the semiconductor 600 on the target substrate. After the position of the semiconductor 600 is determined accurately, the transfer substrate 100 moves to the determined position. Thereafter, the controller 200 controls an output of a second control current to the second magnetic portion 500, such that the driving electromagnetic baffle 530 in the second magnetic portion 500 is energized. The second magnetic baffle may be a permanent magnet, which is adsorbed on the driving electromagnetic baffle under the normal (open-circuit) condition. When it is necessary to enable the second magnetic baffle 520 to move downward, the controller 200 can output the second control current to cause that the driving electromagnetic baffle 530 and the second magnetic baffle 520 repel each other (changing a direction of the current can change the magnetic field of the electromagnet). Therefore, the driving electromagnetic baffle 530 can drive the second magnetic baffles 520 together with the suction disk to move downward (i.e., to move toward the semiconductor 600 on the target substrate). After the second magnetic baffles 520 approach the target substrate 900 and the suction disk 510 picks up the semiconductor 600 on the target substrate, the controller 200 controls the driving electromagnetic baffle 530 to be deenergized. It can be understood that the controller 200 can output another second control current having a different current direction to generate a magnetic field having two opposite electromagnetic polarities, so as to attract the second magnetic baffles. That is, after the semiconductor 600 is picked up, the second magnetic baffles 520 are re-adsorbed on the driving electromagnetic baffle 530.

It should be noted that the movement of the transfer substrate 100 and the infrared emitting portion 400 emitting infrared signals are both controlled by the controller 200. The controller may be a current and logic controller.

Furthermore, when the picked-up semiconductor 600 needs to be transferred to the target substrate, to accurately place the semiconductor 600 on the target substrate, for example, to accurately place the semiconductor 600 at the welding position on the target substrate, after the semiconductor 600 is positioned by the infrared emitting portion 400 and the infrared receiver on the target substrate, the controller 200 outputs a first control current to the first electromagnetic portion 300, to cause the first electromagnetic portion 300 to be energized to generate an electromagnetic force, such that the second magnetic portion disposed in the first electromagnetic portion is moved horizontally. Therefore, a horizontal position of the semiconductor 600 relative to the target substrate can be adjusted, which can ensure that the semiconductor 600 can be accurately placed at the welding position on the target substrate.

In one example, continuing to refer to FIG. 2, the first electromagnetic baffles in the first electromagnetic portion 300 may be electrically coupled to the controller 200 separately, and thus the controller 200 can output first control currents of different intensities to the first electromagnetic baffles, respectively. For example, if it is necessary to adjust the semiconductor to the left by a distance, the controller can output a first control current to a first electromagnetic baffle 310 on the left side of the first electromagnetic portion, to allow the first electromagnetic baffle 310 on the left side of the first electromagnetic portion to attract the second magnetic portion 500 to the left by a distance. After the distance is adjusted, the controller controls the first electromagnetic baffle on the left side of the first electromagnetic portion to be deenergized. Similarly, when the semiconductor needs to be adjusted in other horizontal directions, the controller can output a first control current to another first electromagnetic baffle, such that the horizontal position of the semiconductor relative to the target substrate can be adjusted.

After the horizontal position of the semiconductor 600 relative to the target substrate 900 is adjusted by means of the first electromagnetic portion 300, the semiconductor 600 picked up by the second magnetic portion 500 and the welding position on the target substrate 900 are substantially at a same position on different horizontal planes. Thereafter, the controller 200 can output another second control current to the second magnetic portion 500, to cause the driving electromagnetic baffle 530 to be energized, such that the second magnetic portion 500 can drive the semiconductor 600 to move downward (i.e. to move toward the target substrate 900). After the second magnetic portion 500 approaches the target substrate 900, the controller enables that the suction disk 510 cannot pick up the semiconductor 600 (the suction disk can be coupled to the controller separately), so that the semiconductor 600 can be accurately placed at the welding position on the target substrate 900, and thus the transfer of the semiconductor 600 is completed.

In can be understood that after the semiconductor 600 is transferred, it is possible to detect by an external device whether the semiconductor 600 is placed at the welding position on the target substrate 900. If it is detected that the semiconductor 600 does not be placed at the welding position (i.e., there is a deviation between the position of the semiconductor 600 on the target substrate 900 and the welding position), the controller 200 can output yet another second control current to the second magnetic portion 500 so that the second magnetic portion 500 can pick up the semiconductor 600 again. The foregoing describes the process of picking up the semiconductor by the second magnetic portion in detail, which will not be repeated herein. Thereafter, the controller 200 controls the infrared emitting portion 400 to re-position the welding position on the target substrate 900, to correct the deviation. In one example, the controller 200 outputs another first control current to the first electromagnetic portion 300, such that the first electromagnetic portion 300 is energized and generates an electromagnetic force to cause the second magnetic portion 500 to drive the semiconductor 600 to be moved horizontally, to adjust a horizontal position of the semiconductor 600, thereby correcting the deviation of the position of the semiconductor 600 relative to the welding position. Finally, the controller 200 outputs yet another second control current to the second magnetic portion 500, to allow the second magnetic portion 500 to re-place the semiconductor 600 at the welding position, such that the correction of the position of the semiconductor 600 is completed.

In at least one implementation, the transfer substrate 100 is provided with a sliding rail (not illustrated in the figures), and the first electromagnetic baffle 310 and the driving electromagnetic baffle 530 each are provided with a sliding ball 800. The first electromagnetic baffle 310 and the driving electromagnetic baffle 530 are slidably coupled with the transfer substrate 100, respectively. The sliding ball 800 is adsorbed on the sliding rail by magnetic force, and can slide freely on the sliding rail. It can be understood that the first electromagnetic baffle 310 does not slide in normal use. When it needs to adjust or move the position of the second magnetic portion 500, the first electromagnetic baffle 310 may be moved away.

As one example, the suction disk 510 is a magnet. The controller 200 controls the suction disk 510 to be energized to pick up the semiconductor 600 from the target substrate 900. The semiconductor 600 is a magnetic semiconductor and can be attracted with the suction disk 510. Similarly, when it is necessary to place the semiconductor on the target substrate 900, the controller can control the suction disk to be deenergized or output a reverse magnetic field to enable the semiconductor to be separated from the suction disk, to place the semiconductor 600 on the target substrate 900. As another example, the suction disk 510 is a gas adsorption device, such as a chuck. The controller 200 can also control the chuck to pick up or place the semiconductor 600. Furthermore, the suction disk 510 can also be implemented as a manipulator. The manipulator can also pick up or place the semiconductor 600. It should be understood that the suction disk 510 can also be achieved in many other manners to pick up or place the semiconductor 600.

In one example, the number of the first electromagnetic baffles 310 is the same as that of the second magnetic baffles 520. Each first electromagnetic baffle 310 is arranged in parallel with a corresponding second magnetic baffle 520. For example, when there are four first electromagnetic baffles 310, four second electromagnetic baffles are provided correspondingly. In addition, parallel first electromagnetic baffle 310 and second magnetic baffle 520 repel each other. For example, if the polarity of the second magnetic baffle 520 is S pole, the polarity of the first electromagnetic baffle 310 outside the second magnetic baffle 520 is S pole.

The first electromagnetic baffle 310 and the driving electromagnetic baffle 530 are electromagnets, each of which is composed of a magnetic core and a coil and can generate a magnetic field when a current flows to the coil. The second magnetic baffle 520 is an electromagnet or a permanent magnet. The permanent magnet refers to a magnet that can keep high remanence for a long time under the open-circuit condition. After being energized, the first electromagnetic baffle 310 or the driving electromagnetic baffle 530 causes the second magnetic baffles 520 to move in different directions by electromagnetic force.

The infrared emitting portion 400 includes an infrared emitter (not illustrated in the figures). The infrared emitter can be arranged to be detachably coupled to the first electromagnetic portion 300, to facilitate use and real-time adjustment of the infrared positioning of the semiconductor 600 on the target substrate 900.

Figure 3:
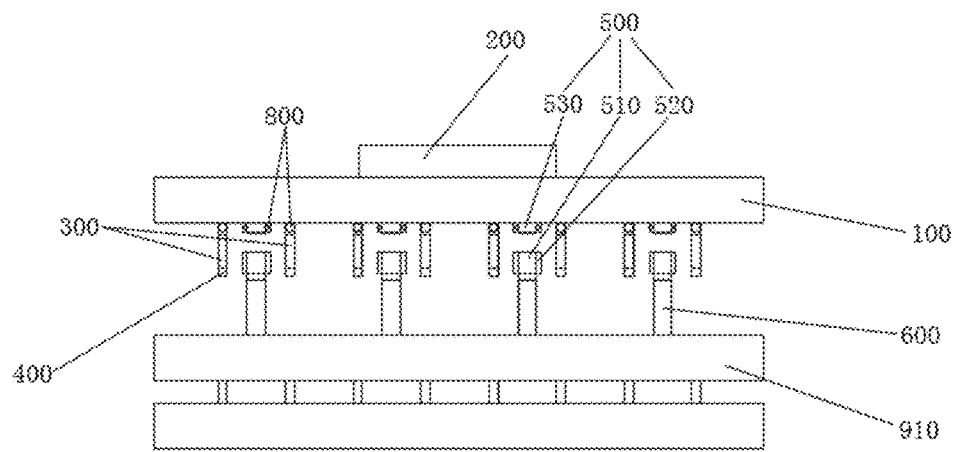
FIG. 3 is a schematic diagram illustrating a state in which a semiconductor is picked up by a device for semiconductor transfer according to the disclosure.
Figure 4:
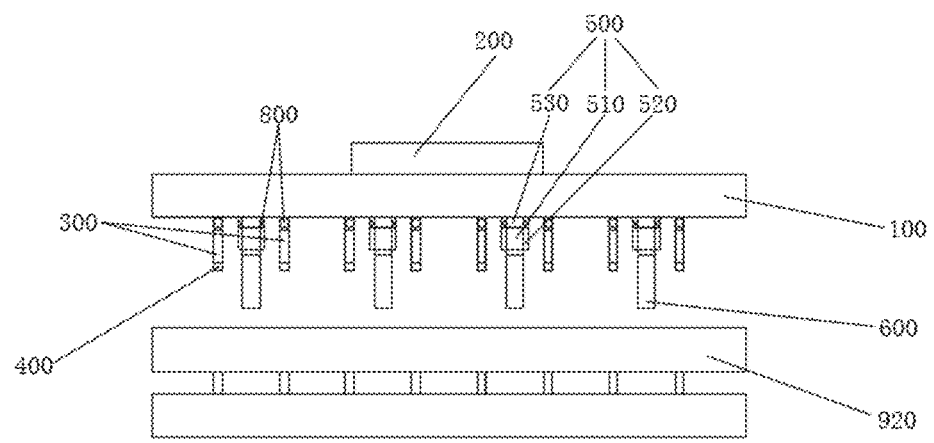
FIG. 4 is a schematic diagram illustrating placing a semiconductor by a device for semiconductor transfer according to the disclosure.

As illustrated in FIG. 3 and FIG. 4, the following illustrates an application scenario, to describe the operating process of the device for semiconductor transfer of the disclosure in more detail.

1. The target substrate includes a first target substrate 910 and a second target substrate 920. The first target substrate is a growth substrate on which semiconductors 600 to be transferred are grown. The second target substrate is a substrate to be transferred that can receive the semiconductors to be transferred 600. The second target substrate is provided with a welding position at which the semiconductor to be transferred 600 is welded.

2. When it is necessary to pick up the semiconductor 600 from the first target substrate, the controller 200 controls the transfer substrate 100 to be moved to be above the first target substrate. The controller 200 controls the infrared emitting portion 400 to emit infrared signals, to position the semiconductor 600 on the first target substrate. After the positioning is completed, the transfer substrate 100 is moved to the positioned position. The controller 200 outputs a second control current to the driving electromagnetic baffle 530, such that the driving electromagnetic baffle 530 generates an electromagnetic force to drive the second magnetic baffles 520 to move downward, to pick up the semiconductor 600 from the first target substrate 910. After the second magnetic portion picks up the semiconductor 600, the controller 200 disables output of the second control current, and the second magnetic baffles 520 move upward to be adsorbed on the driving electromagnetic baffle, to complete the pick-up of the semiconductor 600.

3. When it is necessary to transfer the picked up semiconductor 600 to the second target substrate, the controller 200 controls the transfer substrate 100 to be moved to be above the second target substrate. Thereafter, the controller 200 controls the infrared emitting portion 400 to position the welding position on the second target substrate (it can be understood that an infrared receiver is also provided at the welding position). After the positioning is completed, the controller 200 outputs a second control current to the driving electromagnetic baffle 530, to cause the second magnetic baffles 520 to move downward, to place the semiconductor 600 at a corresponding welding position on the second target substrate, to complete the transfer of the semiconductor 600.

4. The position of the semiconductor 600 transferred to the second target substrate is detected. If it is detected that there is a deviation between the position of the semiconductor 600 and the welding position, the deviation between the position of the semiconductor 600 and the welding position needs to be corrected. The controller 200 can output a second control current to the driving electromagnetic baffle 530, to cause the suction disk 510 to pick up the semiconductor 600 from the second target substrate. Thereafter, the infrared emitting portion 400 re-positions the welding position on the second target substrate. After a new position is positioned, the controller 200 outputs a first control current to the first electromagnetic portion 300 to cause the first electromagnetic portion 300 to generate an electromagnetic force, to adjust a horizontal position of the second magnetic portion 500 provided therein. After the adjustment is completed, the controller 200 controls the driving electromagnetic baffle 530 to be energized to cause the second magnetic baffle 520 to re-place the semiconductor 600 on the second target substrate, to correct the position of the semiconductor 600.

In at least one implementation, an apparatus for semiconductor transfer is further provided according to the above device for semiconductor transfer. The apparatus include a target substrate.

In one example, the target substrate is provided with an infrared receiver for feeding back position information of a semiconductor on the target substrate. The infrared receiver feeds back the position information of the semiconductor on the target substrate to the infrared emitting portion after receiving infrared signals emitted by the infrared emitting portion, to accurately determine the position of the semiconductor.

In one example, the target substrate includes a first target substrate and a second target substrate. Semiconductors to be transferred are grown on the first target substrate. The second target substrate is configured to receive the semiconductors to be transferred, and electrodes corresponding to the semiconductors to be transferred are arranged on the second target substrate. In actual use, the transfer substrate picks up the semiconductor to be transferred from the first target substrate and then transfers the semiconductor to be transferred to corresponding electrodes at the welding position on the second target substrate for welding, thereby realizing the transfer of the semiconductor. The foregoing describes the transfer process in detail, which will not be repeated herein.

In at least one implementation, a method for semiconductor transfer is further provided according to the device for semiconductor transfer described above.

Figure 5:
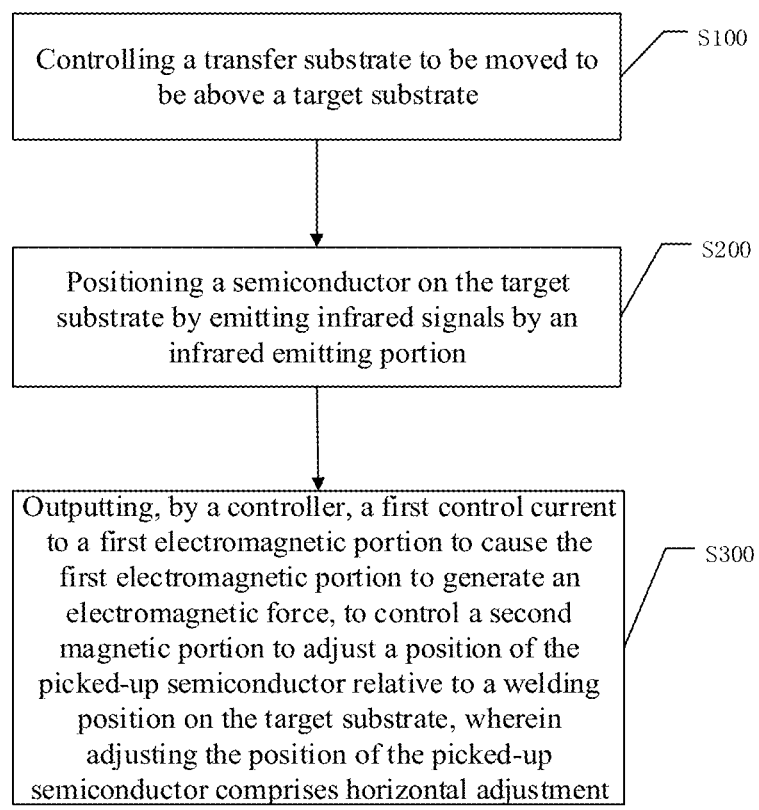
FIG. 5 is a flow chart illustrating a method for semiconductor transfer according to the disclosure.

FIG. 5 is a flow chart illustrating a method for semiconductor transfer according to the disclosure. As illustrated in FIG. 5, the method begins at S100.

At S100, a transfer substrate is controlled to be moved to be above a target substrate.

At S200, a semiconductor on the target substrate is positioned by emitting infrared signals by an infrared emitting portion.

At S300, a controller outputs a first control current to a first electromagnetic portion, to cause the first electromagnetic portion to generate an electromagnetic force to control a second magnetic portion to adjust a position of the picked-up semiconductor relative to a welding position on the target substrate, where adjusting the position of the picked-up semiconductor includes horizontal adjustment.

In at least one implementation, prior to the operations at S300, the following can be conducted.

At S210, the controller outputs a second control current to a second magnetic portion, to cause the second magnetic portion to pick up the semiconductor from the target substrate or place the semiconductor on the target substrate.

According to implementations, continuing to refer to FIG. 1, when it is necessary to pick up the semiconductors 600 from the target substrate, the transfer substrate 100 can be controlled to be moved to be above the target substrate, and then the infrared emitting portion 400 emits infrared signals to position the semiconductor 600 on the target substrate. It can be understood that the target substrate is correspondingly provided with an infrared receiver (not illustrated in the figures). After receiving the infrared signals emitted by the infrared emitting portion 400, the infrared receiver feeds back position information of the semiconductor 600 on the target substrate. After the position of the semiconductor 600 is determined accurately, the transfer substrate 100 moves to the determined position. Thereafter, the controller 200 controls an output of a second control current to the second magnetic portion 500, such that the driving electromagnetic baffle 530 in the second magnetic portion 500 is energized. The second magnetic baffle may be a permanent magnet, which is adsorbed on the driving electromagnetic baffle under the normal (open-circuit) condition. When it is necessary to enable the second magnetic baffle 520 to move downward, the controller 200 can output the second control current to cause that the driving electromagnetic baffle 530 and the second magnetic baffle 520 repel each other (changing a direction of the current can change the magnetic field of the electromagnet). Therefore, the driving electromagnetic baffle 530 can drive the second magnetic baffles 520 together with the suction disk to move downward (i.e., to move toward the semiconductor 600 on the target substrate). After the second magnetic baffles 520 approach the target substrate 900 and the suction disk 510 picks up the semiconductor 600 on the target substrate, the controller 200 controls the driving electromagnetic baffle 530 to be deenergized. It can be understood that the controller 200 can output another second control current having a different current direction to generate a magnetic field having two opposite electromagnetic polarities, so as to attract the second magnetic baffles. That is, after the semiconductor 600 is picked up, the second magnetic baffles 520 are re-adsorbed on the driving electromagnetic baffle 530.

It should be noted that the movement of the transfer substrate 100 and the infrared emitting portion emitting infrared signals are both controlled by the controller 200. The controller may be a current and logic controller.

Furthermore, when the picked-up semiconductor 600 needs to be transferred to the target substrate, to accurately place the semiconductor 600 on the target substrate, for example, to accurately place the semiconductor 600 at the welding position on the target substrate, after the semiconductor 600 is positioned by the infrared emitting portion 400 and the infrared receiver on the target substrate, the controller 200 outputs a first control current to the first electromagnetic portion 300, to cause the first electromagnetic portion 300 to be energized to generate an electromagnetic force, such that the second magnetic portion disposed in the first electromagnetic portion is moved horizontally. Therefore, a horizontal position of the semiconductor 600 relative to the target substrate can be adjusted, which can ensure that the semiconductor 600 can be accurately placed at the welding position on the target substrate.

In one example, continuing to refer to FIG. 2, the first electromagnetic baffles in the first electromagnetic portion 300 may be electrically coupled to the controller 200 separately, and thus the controller 200 can output first control currents of different intensities to the first electromagnetic baffles, respectively. For example, if it is necessary to adjust the semiconductor to the left by a distance, the controller can output a first control current to a first electromagnetic baffle 310 on the left side of the first electromagnetic portion, to allow the first electromagnetic baffle 310 on the left side of the first electromagnetic portion to attract the second magnetic portion 500 to the left by a distance. After the distance is adjusted, the controller controls the first electromagnetic baffle on the left side of the first electromagnetic portion to be deenergized. Similarly, when the semiconductor needs to be adjusted in other horizontal directions, the controller can output a first control current to another first electromagnetic baffle, such that the horizontal position of the semiconductor relative to the target substrate can be adjusted.

After the horizontal position of the semiconductor 600 relative to the target substrate 900 is adjusted by means of the first electromagnetic portion 300, the semiconductor 600 picked up by the second magnetic portion 500 and the welding position on the target substrate 900 are substantially at a same position on different horizontal planes. Thereafter, the controller 200 can output another second control current to the second magnetic portion 500, to cause the driving electromagnetic baffle 530 to be energized, such that the second magnetic portion 500 can drive the semiconductor 600 to move downward (i.e. to move toward the target substrate 900). After the second magnetic portion 500 approaches the target substrate 900, the controller enables that the suction disk 510 cannot pick up the semiconductor 600 (the suction disk can be coupled to the controller separately), so that the semiconductor 600 can be accurately placed at the welding position on the target substrate 900, and thus the transfer of the semiconductor 600 is completed.

According to the device, apparatus, and method for semiconductor transfer provided herein, the transfer substrate is controlled to be moved to be above the target substrate. The infrared emitting portion emits infrared signals to position the semiconductor on the target substrate. After the second magnetic portion picks up the semiconductor from the target substrate, the controller outputs the first control current to the first electromagnetic portion to cause the first electromagnetic portion to generate an electromagnetic force, to control the second magnetic portion to adjust a position of the picked up semiconductor relative to the welding position on the target substrate, where adjusting the position of the picked-up semiconductor includes horizontal adjustment. In this way, it is possible to ensure the accurate alignment of the semiconductor and the target substrate in the transfer process. The device for semiconductor transfer provided herein can accurately pick up semiconductors with aid of an infrared function, and can also adjust the horizontal position of the semiconductors by magnetic force after picking up the semiconductor, thereby providing accurate positioning for the semiconductor when the semiconductor needs to be welded on the target substrate and avoiding inaccuracy of welding of the semiconductor.

Those skilled in the art will easily think of other implementations of the disclosure after considering the specification and practicing the disclosure herein. The disclosure is intended to cover any variations, usages, or adaptive changes of the disclosure. These variations, usages, or adaptive changes follow the general principles of the disclosure and include common knowledge or conventional technical means in the technical field not disclosed in this disclosure. The description and embodiments are merely regarded as exemplary, and the scope and spirit of the disclosure depend on the claims.

What is claimed is:

1. A device for semiconductor transfer, comprising:
   a transfer substrate;
   a controller disposed on the transfer substrate;
   a first electromagnetic portion disposed on the transfer substrate and electrically coupled to the controller;
   an infrared emitting portion disposed on a surface of the first electromagnetic portion and electrically coupled to the controller; and
   a second magnetic portion movably disposed in the first electromagnetic portion and configured to pick up a semiconductor from a target substrate, wherein the semiconductor is a magnetic semiconductor, wherein the transfer substrate is capable of being moved to be above the target substrate;
   the infrared emitting portion is configured to emit infrared signals to position the semiconductor on the target substrate; and
   the controller is configured to output a first control current to the first electromagnetic portion to cause the first electromagnetic portion to generate an electromagnetic force, to control the second magnetic portion to adjust a horizontal position of the picked-up semiconductor relative to the target substrate.

2. The device of claim 1, wherein the controller is further configured to output a second control current to the second magnetic portion to cause the second magnetic portion, to pick up the semiconductor from the target substrate or place the semiconductor on the target substrate.

3. The device of claim 1, wherein the first electromagnetic portion comprises a plurality of first electromagnetic baffles movably disposed on the transfer substrate, wherein each first electromagnetic baffle is electrically coupled to the controller, and each two adjacent first electromagnetic baffles are perpendicular to each other.

4. The device of claim 3, wherein the second magnetic portion comprises:
   a driving electromagnetic baffle disposed on the transfer substrate and electrically coupled to the controller;
   a suction disk magnetically coupled to the driving electromagnetic baffle; and
   a plurality of second magnetic baffles fixedly arranged around the suction disk.

5. The device of claim 4, wherein number of the plurality of first electromagnetic baffles is the same as that of the plurality of second magnetic baffles, wherein each first electromagnetic baffle is parallel to a corresponding second magnetic baffle.

6. The device of claim 4, wherein the transfer substrate is provided with a sliding rail, and the first electromagnetic baffle and the driving electromagnetic baffle each are provided with a sliding ball, wherein the first electromagnetic baffle and the driving electromagnetic baffle are slidably coupled with the transfer substrate, respectively.

7. The device of claim 5, wherein the first electromagnetic baffle and the driving electromagnetic baffle are electromagnets, and the second magnetic baffle is a permanent magnet or an electromagnet.

8. The device of claim 1, wherein the infrared emitting portion comprises an infrared emitter detachably coupled to the first electromagnetic portion.

9. The device of claim 4, wherein the suction disk is a magnet, a chuck, or a manipulator.

10. An apparatus for semiconductor transfer, comprising:
    a target substrate; and
    a device for semiconductor transfer, wherein the device for semiconductor transfer comprises:
    a transfer substrate;
    a controller disposed on the transfer substrate;
    a first electromagnetic portion disposed on the transfer substrate and electrically coupled to the controller;
    an infrared emitting portion disposed on a surface of the first electromagnetic portion and electrically coupled to the controller; and
    a second magnetic portion movably disposed in the first electromagnetic portion and configured to pick up a semiconductor from the target substrate, wherein the semiconductor is a magnetic semiconductor, wherein the transfer substrate is capable of being moved to be above the target substrate;

the infrared emitting portion is configured to emit infrared signals to position the semiconductor on the target substrate; and the controller is configured to output a first control current to the first electromagnetic portion to cause the first electromagnetic portion to generate an electromagnetic force, to control the second magnetic portion to adjust a horizontal position of the picked-up semiconductor relative to the target substrate.

11. The apparatus of claim 10, wherein the target substrate is provided with an infrared receiver for feeding back position information of the semiconductor on the target substrate.

12. The apparatus of claim 10, wherein the target substrate comprises:

a first target substrate on which a semiconductor to be transferred is grown; and a second target substrate configured to receive the semiconductor to be transferred.

13. The apparatus of claim 12, wherein the second target substrate is provided with electrodes corresponding to the semiconductor to be transferred.

14. The apparatus of claim 10, wherein the controller is further configured to output a second control current to the second magnetic portion to cause the second magnetic portion, to pick up the semiconductor from the target substrate or place the semiconductor on the target substrate.

15. The apparatus of claim 10, wherein the first electromagnetic portion comprises a plurality of first electromagnetic baffles movably disposed on the transfer substrate, wherein each first electromagnetic baffle is electrically coupled to the controller, and each two adjacent first electromagnetic baffles are perpendicular to each other.

16. The apparatus of claim 15, wherein the second magnetic portion comprises:

a driving electromagnetic baffle disposed on the transfer substrate and electrically coupled to the controller;

a suction disk magnetically coupled to the driving electromagnetic baffle; and a plurality of second magnetic baffles fixedly arranged around the suction disk.

17. The apparatus of claim 16, wherein number of the plurality of first electromagnetic baffles is the same as that of the plurality of second magnetic baffles, wherein each first electromagnetic baffle is parallel to a corresponding second magnetic baffle.

18. The apparatus of claim 17, wherein two opposite second magnetic baffles repel each other, and parallel first electromagnetic baffle and second magnetic baffle repel each other.

19. A method for semiconductor transfer, comprising:

controlling a transfer substrate to be moved to be above a target substrate;

positioning a semiconductor on the target substrate by emitting infrared signals by an infrared emitting portion; and outputting, by a controller, a first control current to a first electromagnetic portion to cause the first electromagnetic portion to generate an electromagnetic force, to control a second magnetic portion to adjust a horizontal position of the picked-up semiconductor relative to the target substrate, wherein adjusting the position of the picked-up semiconductor comprises adjustment.

20. The method of claim 19, further comprising:

outputting, by the controller, a second control current to a second magnetic portion, to cause the second magnetic portion to pick up the semiconductor from the target substrate or place the semiconductor on the target substrate.

* * * * *